United States Patent [19]

Ludwig

[11] Patent Number: 5,649,418
[45] Date of Patent: Jul. 22, 1997

[54] INTEGRATED POWER CONVERTER COOLING SYSTEM USING TURBINE INTAKE AIR

[75] Inventor: George A. Ludwig, San Diego, Calif.

[73] Assignee: Solar Turbines Incorporated, San Diego, Calif.

[21] Appl. No.: 512,008

[22] Filed: Aug. 7, 1995

[51] Int. Cl.[6] .................................................... F02C 7/12
[52] U.S. Cl. ........................... 60/39.33; 60/39.83; 290/52
[58] Field of Search ......................... 60/39.33, 39.83; 290/52

[56] References Cited

U.S. PATENT DOCUMENTS

| | | | |
|---|---|---|---|
| 2,717,489 | 9/1955 | Hasbrouck | 60/39.83 |
| 3,418,485 | 12/1968 | Anderson et al. | 290/52 |
| 3,791,682 | 2/1974 | Mitchell | 290/52 |
| 4,002,023 | 1/1977 | Hartmann | 60/39.33 |
| 4,555,637 | 11/1985 | Irvine | 290/52 |

FOREIGN PATENT DOCUMENTS

| | | | |
|---|---|---|---|
| 32041 | 4/1981 | Japan | 60/39.83 |

*Primary Examiner*—Charles G. Freay
*Attorney, Agent, or Firm*—Larry G. Cain

[57] ABSTRACT

Air flow cooling systems are used to increase component life. The present air flow cooling system increases the component life, increases efficiencies and eliminated components. For example, the power source or gas turbine engine is used to cause a flow of air around and about electrical components which need cooling. A plurality of compartments insure the direction of a flow of cooling air around and along the electrical components and the compressor section of the gas turbine engine causes the air to flow around and along the electrical components.

15 Claims, 4 Drawing Sheets

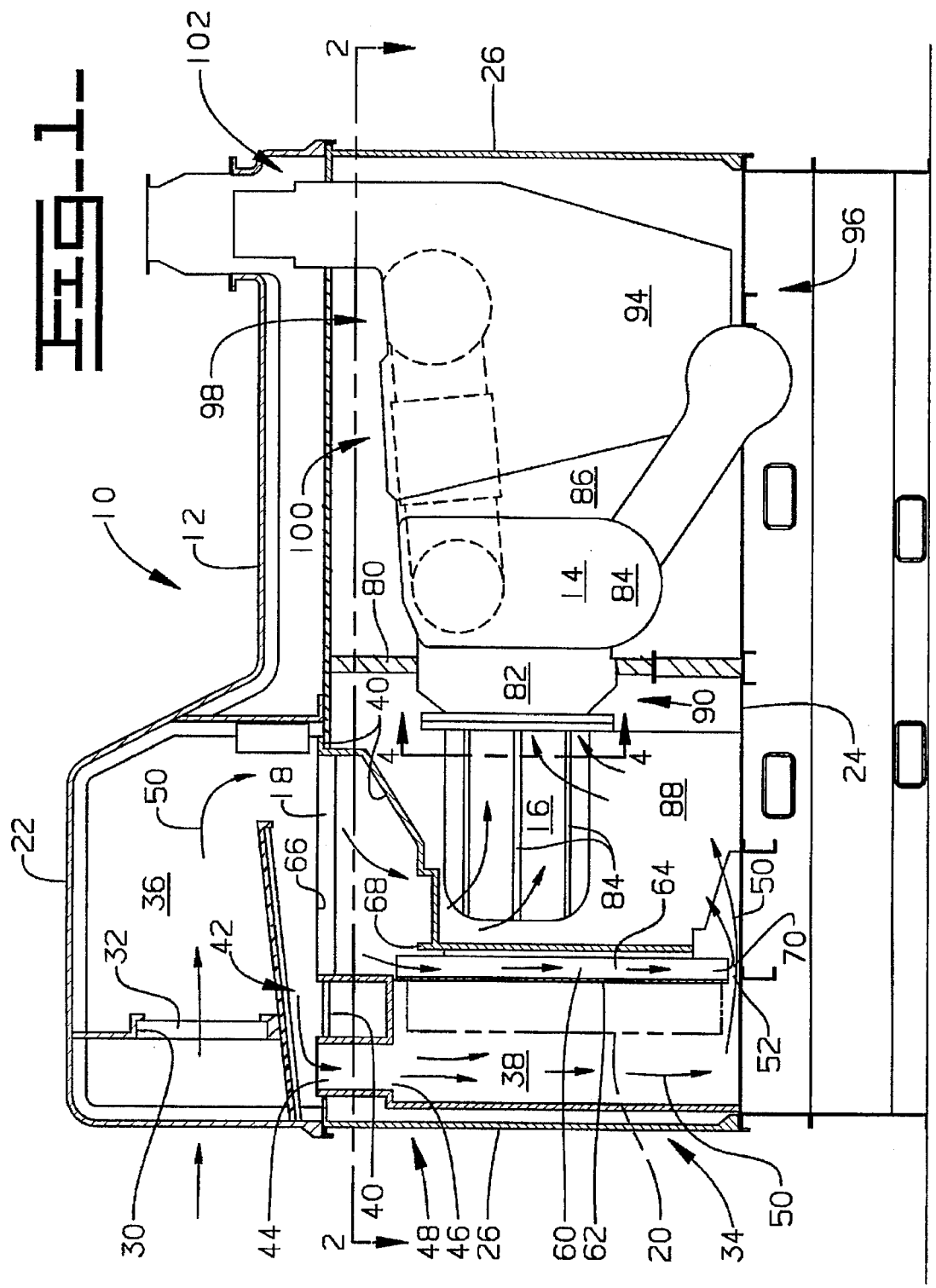

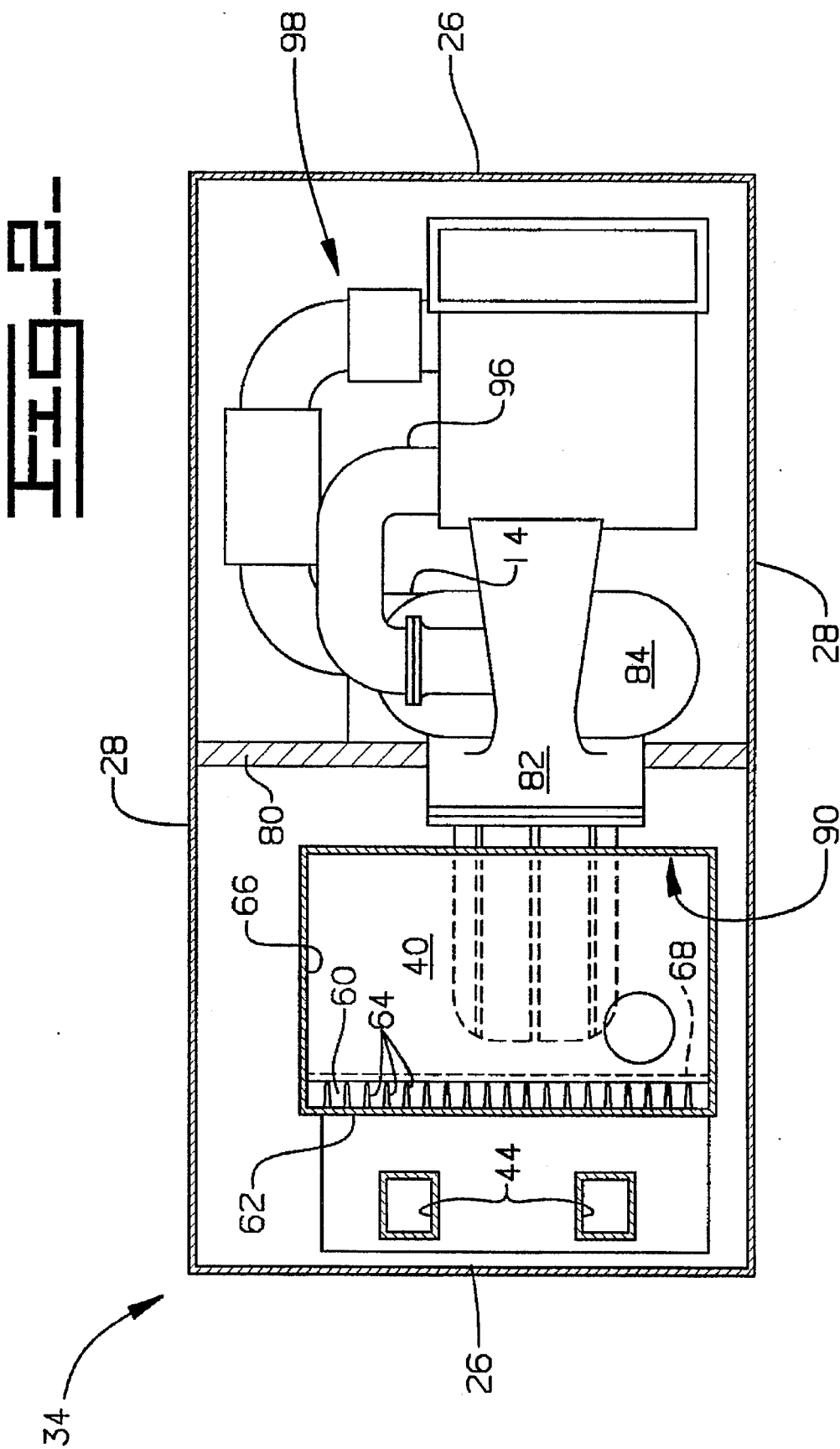

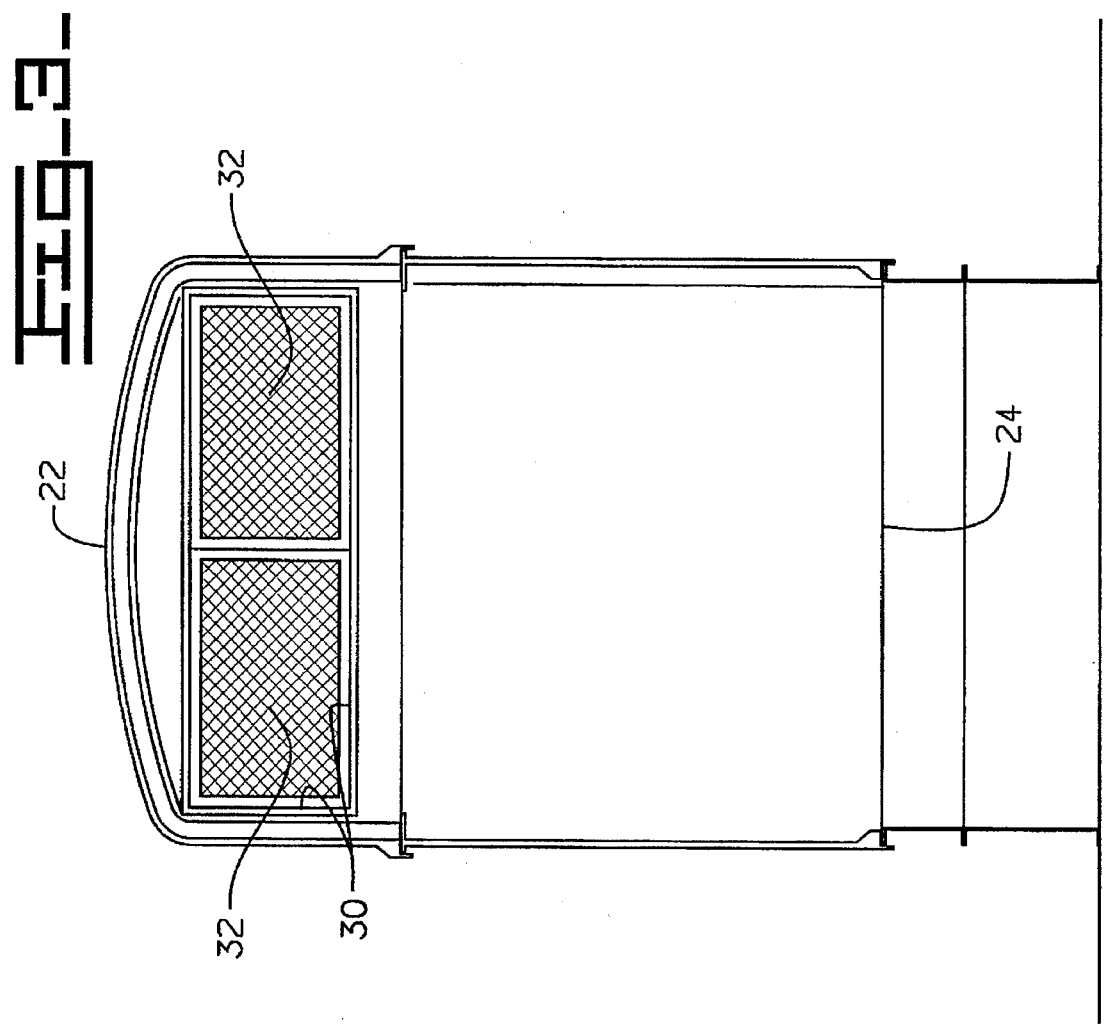

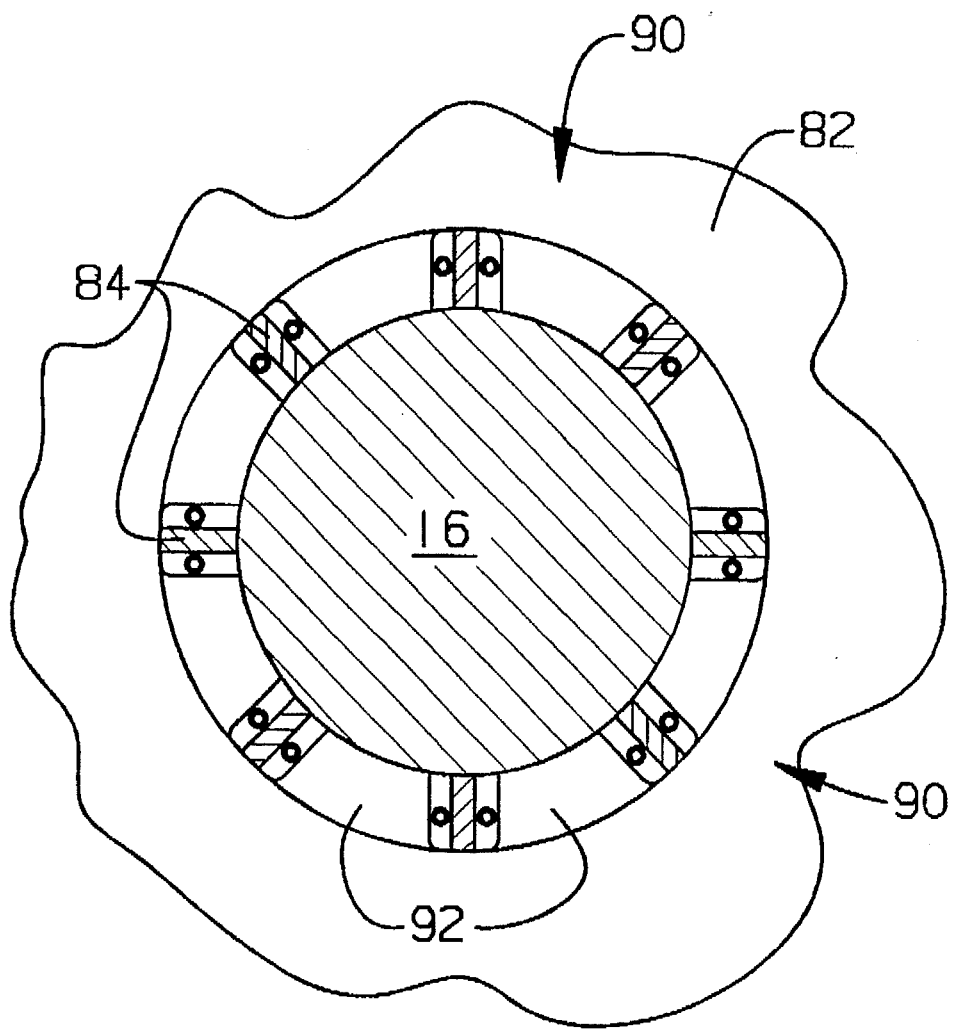
Fig_4_

5,649,418

INTEGRATED POWER CONVERTER COOLING SYSTEM USING TURBINE INTAKE AIR

TECHNICAL FIELD

This invention relates generally to an integrated prime mover and electric power generation/conditioning system and an improved system for cooling and dissipating the mechanical and electrical heat losses.

BACKGROUND ART

Generators are a type of electric machines used to produce electrical energy. Generator operation is based on the principle of electrical induction, whereby a periodic flow of electricity is produced in a loop-type conductor as a result of the periodic variation of the flux of the magnetic lines of force passing through the loop. To do this, either the loop is caused to rotate in a constant magnetic field or, alternatively, the magnetic field can be rotated. Thus, a gap is formed between the rotating element and the stationary element. Many generators cool the rotating and stationary elements by passing air through the gap between these components to increase life and efficiency of the generator.

Thus, the electrical energy is directed to a power converter and conversion takes place. The conversion process produces heat and thus the power converter requires cooling.

Many generators utilize air cooling in which a fan or pump is used to accelerate the air entering the gap. Furthermore, such fans and pumps have been used to cool the components during the electrical conversion into phase changes and converting from direct current to alternating current.

Solutions to the cooling problems complicate the structure, increase cost and complicate the system design used to cool generators, motors and converting equipment while attempting to increase efficiency.

The present invention is directed to overcoming one or more of the problems as set forth above.

DISCLOSURE OF THE INVENTION

In one aspect of the present invention, an air flow cooling system is positioned within an enclosure. The air flow cooling system provides a cooling fluid to cool electrical components and provides a combustible fluid to a gas turbine engine having a compressor section and a combustor section. The air flow cooling system is comprised of a filter through which said cooling fluid is at least partially cleaned. A plurality of compartments have at least a portion of the electrical components positioned therein, and the cooling flow is directed from the filter through said plurality of compartments around and along said electrical components prior to entering the compressor section and being directed to the combustor section of the gas turbine engine.

In another aspect of the invention, an air flow cooling system is positioned within an enclosure, the air flow cooling system provides a cooling fluid to cool electrical components and provides a combustible fluid to a gas turbine engine. The air flow cooling system is comprised of a plurality of compartments having at least a portion of the electrical components positioned therein, and the cooling flow is directed through the plurality of compartments around and along the electrical components prior to entering the gas turbine engine.

BRIEF DESCRIPTION OF THE DRAWINGS

FIG. 1 is a partially sectioned side view of an integral electric machine and gas turbine engine embodying the present invention;

FIG. 2 is a sectional view of a portion of the cooling system generally taken alone line 2—2 of FIG. 1;

FIG. 3 is a front view of a portion of the cooling system; and

FIG. 4 is a partially sectioned view of a portion of the cooling system taken along line 4—4 of FIG. 1.

BEST MODE FOR CARRYING OUT THE INVENTION

Referring to FIG. 1, an air flow cooling system 10 is shown. The air flow cooling system 10 includes an enclosure 12 having a gas turbine engine 14 and an electric machine 16, which in this application is a generator, positioned therein. Further positioned within the enclosure 12 and forming a part of the air flow cooling system 10 is a heat exchanger 18 and an integrated power converter 20, of which the outline is generally shown in phantom. The enclosure 12 includes a top portion 22, a bottom portion 24, a pair of end portions 26 and a pair of side portions 28, as best shown in FIG. 2. As further shown in FIG. 3, the enclosure 12 further includes an inlet opening 30 positioned in one of the pair of end portions 26. A filter 32 is positioned within the inlet opening 30 and the enclosure 12 is divided into a plurality of compartments 34. For example, the inlet portion 30 is in communication with a first compartment 36, which in this application, located above the gas turbine engine 14, generator 16 and the integrated power converter 20. The first compartment is further defined by the top portion 22, the upper extremity of one of the pair of end portions 26 and the upper extremity of the pair of side portions 28. The first compartment 36 is separated from a second compartment 38 by a partition 40. Thus, the first compartment is defined by the top portion 22, the upper extremities of the pair of end portion 26 and the pair of side portions 28 and the portion 40.

The partition 40 includes a plurality of openings 42 of which a pair of opening 44 allow communication between the first compartment 36 and the second compartment 38. The second compartment 38 is axially positioned from the gas turbine engine 10 and the generator 16 and is generally in line therewith. The second compartment 38 is further defined by the remainder of the one of the end portions 26, a portion of the pair of side portions 28, the bottom portion 24 and the power converter 20. The second compartment 38 is generally closed with the exception of the pair of openings 44 which are positioned near a top portion 46 of the second compartment 38 and act as an inlet portion 48 to filtered atmospheric air, designated by arrows 50, which will be used for cooling and an outlet portion 52 near the bottom portion 24 of the enclosure 12. Thus, the second compartment 38 is defined by the inlet portion 48 near the pair of openings 44, one of the pair of end portions 26, a portion of the pair of side portions 28, the outlet portion 52 and the power converter 20.

Further positioned within the enclosure 12 and forming another part of the air flow cooling system 10 is a third compartment 60. The third compartment 60 is positioned below the first compartment 36 and is axially positioned between the second compartment 38 and the gas turbine engine 14 and the generator 16. Positioned in the third compartment 60 and attached to a plate member 62 formed as an integral part of the integrated power converter 20 is a plurality of fins 64. A portion of the partition 40 separates the third compartment 60 from the first compartment 36 and a first opening 66, allows communication between the first compartment 36 and the third compartment 60. A vertical portion 68 separates the third compartment 60 from the gas turbine engine 14 and the generator 16. The horizontal partition 68 is further positioned between the extremity of the plurality of fins 64 and the gas turbine engine 14 and the generator 16. The plate member 62 is sealingly attached to a portion of the partition 40 and forms another parameter of the third compartment 60. The third compartment 60 further includes an outlet portion 70 positioned near the bottom portion 24 of the enclosure 12. Thus, the third compartment is defined by the first opening 66, an inlet, the horizontal partition 68, the plate member 62, a portion of the pair of side portions 28 and the outlet portion 70.

The gas turbine engine 14 is supported within the enclosure 10 by a structural member 80. The gas turbine engine 14 includes a compressor section 82, a combustor section 84 and a turbine section 86. A bulkhead member 81 also functions as a partition and assists in forming a fourth compartment 88. The fourth compartment 88 is formed by the bulkhead member 81, a portion of the pair of side portions 28, the partition 40, the horizontal portion 68 and the bottom portion 24. An inlet opening 89 is positioned in the partition 40 and communicates between the fourth compartment 88 and the first compartment 36. The generator 16 is physically positioned within the fourth compartment 88 and a plurality of fins 84 extend about the generator 16. The compressor section 82 includes an inlet portion 90 being in communication with the filter atmospheric air 50 and an outlet portion is in communication with the combustor section 84. As best shown in FIG. 4, the inlet portion 90 includes a plurality of opening or galleries 92 spaced between the plurality of fins 84. In this application, the gas turbine engine further includes a recuperator 94 having an air inlet end portion 96 for the air 50 and an air outlet end portion 98 being in communication with the combustor section 84.

As an alternative, the gas turbine engine 14 could be void of the recuperator 94 without changing the gist of the invention.

The resulting structure more efficiently uses the flow of filtered atmospheric air 50 to be used for combustion by the gas turbine engine 14. The need for auxiliary fans to produce cooling air is eliminated. The net result of the structure eliminates components, directs the filtered atmospheric air 50 to components to be cooled prior to being used for combustion within the gas turbine engine.

INDUSTRIAL APPLICABILITY

In operation, the gas turbine engine 14 is started. The air flow cooling system 10 is initiated when the combustion air 50 is drawn through the filter 32 and enters into the first compartment 36 wherein a portion of the air 50 is divided and passes through the plurality of openings 42 into the second compartment 38. Another portion of the air 50 from the first compartment 36 passes through the first opening 66, passes through the heat exchanger 18 and enters the third compartment 60. At the same time, a portion of the air 50 passes through the first opening 66, passes through the heat exchanger 18 and continues through the inlet opening 89 and enters into the forth compartment 88. The air 50 exits the first compartment 36 through the outlet 52 and enters the fourth compartment 88 and air 50 exits the second compartment 60 through the outlet portion 70 and enters the fourth compartment 88. Thus, all of the air 50 is deposited into the fourth compartment 88 and drawn through the plurality of openings 92 into the compressor section 82 of the gas turbine eigne 14.

The air 50 within the second compartment 38 acts as a cooling media as the air 50 passes around and along the integrated power converter 20 prior to exiting the outlet portion 52 and entering the fourth compartment 88. The air 50 within the third compartment 60 acts as a cooling media as the air 50 passes around and along the plurality of fins 64, thus, further cooling the integrated power converter 20. Additionally, the air 50 passes around and along the extremity of the generator 16 and the plurality of fins 84 on the generator 16 before entering the compressor section 82 of the gas turbine engine 14. Thus, the air 50 cools the integrated power converter 20 and the generator 16 prior to being used as combustion air 50 for the gas turbine engine 14.

It has been further contemplated that the air flow cooling system 10 can be further simplified. For example, cooling air 50 passing through the second compartment 38 can be eliminated. And, it is further contemplated that the cooling air 50 passing through the inlet opening 89 can be eliminated. Thus, the cooling air 50 would travel solely through the first compartment 36 into the third compartment 60 pass around and along the plurality of fins 84 exit the outlet portion 70 and be drawn through the plurality of opening 92 into the compressor section 82 of the gas turbine engine 14. Another alternative, would eliminate the air 50 flow through the second compartment 38 and continue to allow an air 50 flow through the inlet opening 89.

The air flow cooling system 10 includes a structure which more efficiently uses the flow of filtered atmospheric air 50 to be used for combustion by the gas turbine engine 14. The need for auxiliary fans to produce cooling air is eliminated. The net result of the structure eliminates components, directs the filtered atmospheric air 50 directly to components to be cooled prior to being used for combustion within the gas turbine engine 14.

By using the large mass flow of the air 50 drawn by the gas turbine engine 14 and flowing the air 50 over the fins 64, the physical size of the power converter heat sink is reduced several fold from its size if cooled by normal free convection. Thus, the total size, weight and cost of the integrated prime mover and electrical power generation/conditioning system are reduced from conventional construction.

Other aspects, objects and advantages of this invention can be obtained from a study of the drawings, the disclosure and the appended claims.

I claim:

1. An air flow cooling system being positioned within an enclosure, said air flow cooling system providing a cooling fluid to cool electrical components including an electric machine and an integrated power converter and providing a combustible fluid to a gas turbine engine having a compressor section and a combustor section, said air flow cooling system comprising:

a filter through which said cooling fluid is at least partially cleaned;

a plurality of compartments, having at least a portion of said electrical components positioned therein including a compartment in which said electric machine is positioned and an another compartment in which the integrated power converter is cooled; and said cooling flow being directed from said filter through said plurality of compartments around and along said electrical components prior to entering the compressor section and being directed to the combustor section of the gas turbine engine and said cooling flow directionally cooling the integrated power converter prior to cooling the electric machine.

2. The air flow cooling system of claim 1 wherein said integrated power converter includes a plate member being formed as a part of the integrated power converter and said plate member includes a plurality of fins attached thereto.

3. The air flow cooling system of claim 2 wherein said plurality of fins are in heat dissipating relationship to the cooling fluid.

4. The air flow cooling system of claim 1 wherein said electric machine includes a plurality of fins which are in heat dissipating relationship to the cooling fluid.

5. The air flow cooling system of claim 1 wherein said plurality of compartments includes a first compartment from which the cooling fluid is distributed to a second compartment and to a third compartment.

6. The air flow cooling system of claim 5 wherein a plate member separates the first compartment from said second compartment and the cooling fluid passing through each of the first compartment and the second compartment cools a integrated power converter.

7. The air flow cooling system of claim 5 wherein said first compartment includes a heat exchanger positioned therein.

8. The air flow delivery system of claim 1 wherein said plurality of compartments include a first compartment.

9. The air flow delivery system of claim 8 wherein said first compartment has said filter positioned therein.

10. An air flow cooling system being positioned within an enclosure, said air flow cooling system providing a cooling fluid to cool electrical components and providing a combustible fluid to a gas turbine engine, said air flow cooling system comprising:

a plurality of compartments, having at least a portion of said electrical components positioned therein, said plurality of compartments including a first compartment, a second compartment and a third compartment having a plate member positioned therein being in heat conducting relationship with a power converter; and said cooling flow being directed through said plurality of compartments around and along said electrical components prior to entering the gas turbine engine.

11. The air flow delivery system of claim 10 wherein said second compartment has said power converter positioned therein.

12. The air flow delivery system of claim 10 wherein said plate member includes a plurality of fins.

13. The air flow delivery system of claim 10 wherein said plurality of compartments includes a fourth compartment.

14. The air flow delivery system of claim 13 wherein said fourth compartment includes an electric machine positioned therein.

15. The air flow delivery system of claim 14 wherein said electric machine includes a plurality of fins attached thereto.

\* \* \* \* \*